United States Patent
Hatori et al.

(10) Patent No.: US 12,185,470 B2
(45) Date of Patent: Dec. 31, 2024

(54) EMBEDDED PRINTED CIRCUIT BOARD

(71) Applicant: SHINKO ELECTRIC INDUSTRIES CO., LTD., Nagano (JP)

(72) Inventors: Yukinori Hatori, Nagano (JP); Takashi Kurihara, Nagano (JP); Kiyoshi Oi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 184 days.

(21) Appl. No.: 18/169,432

(22) Filed: Feb. 15, 2023

(65) Prior Publication Data

US 2023/0276575 A1    Aug. 31, 2023

(30) Foreign Application Priority Data

Feb. 28, 2022  (JP) .................. 2022-029985

(51) Int. Cl.
  *H05K 1/00* (2006.01)
  *H05K 1/11* (2006.01)
  *H05K 1/18* (2006.01)
  *H05K 3/46* (2006.01)

(52) U.S. Cl.
  CPC ............ *H05K 1/185* (2013.01); *H05K 1/115* (2013.01); *H05K 3/4605* (2013.01); *H05K 2201/10636* (2013.01)

(58) Field of Classification Search
  CPC ...... H05K 1/185; H05K 1/115; H05K 3/4605; H05K 2201/10636
  See application file for complete search history.

(56) References Cited

U.S. PATENT DOCUMENTS

| | | | |
|---|---|---|---|
| 2014/0151860 A1 | 6/2014 | Nakamura et al. | |
| 2016/0165731 A1* | 6/2016 | Hurwitz | H01L 23/5389 216/17 |
| 2017/0365568 A1* | 12/2017 | Ban | H01L 24/14 |
| 2019/0088566 A1* | 3/2019 | Ha | H01L 23/3114 |

FOREIGN PATENT DOCUMENTS

WO    2013/121732    8/2013

* cited by examiner

*Primary Examiner* — Pete T Lee
(74) *Attorney, Agent, or Firm* — IPUSA, PLLC

(57) ABSTRACT

An embedded PCB includes a first substrate, an electronic component mounted on the first substrate, a second substrate provided on a side opposite to the first substrate with the electronic component interposed therebetween, and electrically connected to the first substrate via substrate bonding members, and an encapsulating resin filled between the first and second substrates, covering the electronic component, and also filled between the electronic component and the first substrate. The first substrate includes, on a side closer to the electronic component, pads to be bonded to electrodes of the electronic component via bonding portions, and a protective insulating layer including openings. The pads include outermost peripheral pads in an outermost periphery including four corners of an approximately rectangular area in a plan view, and inner pads in an area surrounded by the outermost peripheral pads.

9 Claims, 6 Drawing Sheets

1

EMBEDDED PRINTED CIRCUIT BOARD

CROSS-REFERENCE TO RELATED APPLICATIONS

This application is based upon and claims priority to Japanese Patent Application No. 2022-029985, filed on Feb. 28, 2022, the entire contents of which are incorporated herein by reference.

FIELD

Certain aspects of the embodiments discussed herein are related to embedded printed circuit boards embedded with electronic components, and methods for manufacturing embedded printed circuit boards. The embedded printed circuit board is sometimes also referred to as an electronic component embedded substrate or board, an embedded substrate or board, an electronic component incorporating substrate or board, or the like.

BACKGROUND

An embedded printed circuit board proposed in International Publication Pamphlet No. WO 2013/121732, for example, includes a first substrate, a second substrate opposing the first substrate, substrate bonding members interposed between the first substrate and the second substrate and transmitting signals between the first substrate and the second substrate, and a resin filler encapsulating between the first substrate and the second substrate where the substrate bonding members are interposed. An electronic component, such as a semiconductor chip or the like, is mounted on the first substrate.

In a manufacturing process of the embedded printed circuit board, such as the proposed embedded printed circuit board described above, after the electronic component is mounted on the first substrate, the first substrate and the second substrate are bonded to each other via the substrate bonding members. When bonding the first substrate and the second substrate to each other, the first substrate and the second substrate are heated to a predetermined temperature. For this reason, a thermal stress is applied to a bonding portion between the electronic component and the first substrate, and the bonding portion may break due to the thermal stress.

SUMMARY

One object according to an aspect of the present disclosure is to provide an embedded printed circuit board having an improved bonding strength between a first substrate and an electronic component.

According to one aspect of the present disclosure, an embedded printed circuit board includes a first substrate; an electronic component mounted on the first substrate; a second substrate provided on a side opposite to the first substrate with the electronic component interposed therebetween, and electrically connected to the first substrate via substrate bonding members; and an encapsulating resin that is filled between the first substrate and the second substrate, covering the electronic component, and also filled between the electronic component and the first substrate, wherein the first substrate includes, on a side closer to the electronic component, multiple pads to be bonded to electrodes of the electronic component via bonding portions, and a protective insulating layer including openings, the multiple pads include outermost peripheral pads separated from one another and arranged at positions in an outermost periphery including four corners of an approximately rectangular area in a plan view, and inner pads separated from one another and arranged at positions in an area surrounded by the outermost peripheral pads in the plan view, the outermost peripheral pads arranged at the four corners, among the outermost peripheral pads, are exposed inside the openings in a state separated from the protective insulating layer, and outer peripheries of the inner pads are covered with the protective insulating layer, and portions of upper surfaces of the inner pads are exposed inside the openings.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
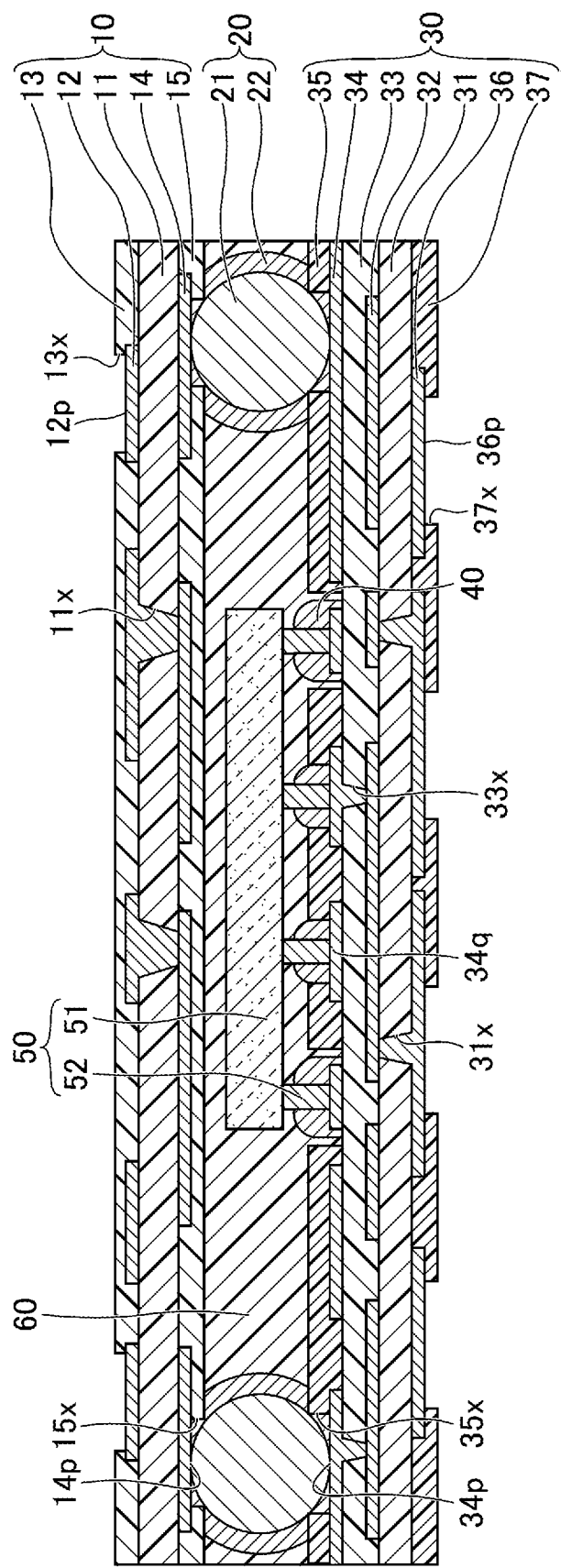
FIG. 1 is a cross sectional view illustrating an example of an embedded printed circuit board according to a first embodiment.

Preferred embodiments of the present invention will be described with reference to the accompanying drawings. In the drawings, those constituent elements that are the same are designated by the same reference numerals, and a repeated description of the same constituent elements may be omitted.

First Embodiment

[Structure of Embedded Printed Circuit Board]

First, the structure of the embedded printed circuit board (PCB) according to a first embodiment will be described. FIG. 1 is a cross sectional view illustrating the embedded PCB according to the first embodiment.

As illustrated in FIG. 1, an embedded PCB 1 includes a substrate 10, substrate bonding members 20, a substrate 30, bonding portions 40, a semiconductor chip 50, and a mold resin 60. In the embedded PCB 1, the semiconductor chip 50 is mounted on the substrate 30. The substrate 10 is provided on an opposite side from the substrate 30, and the semiconductor chip 50 interposed between the substrate 10 and the substrate 30. The substrate 10 is electrically connected to the substrate 30 via the substrate bonding members 20. The substrate 30 is an example of a first substrate according to the present disclosure, and the substrate 10 is an example of a second substrate according to the present disclosure.

In the present embodiment, for the sake of convenience, a side of the embedded PCB 1 provided with a solder resist layer 13 in FIG. 1 will be referred to as an upper side or one side, and a side of the embedded PCB 1 provided with a solder resist layer 37 will be referred to as a lower side or the other side. In addition, a surface of each portion of the embedded PCB 1, located closer to the solder resist layer 13, will be referred to as one surface or an upper surface, and a surface of each portion of the embedded PCB 1, located closer to the solder resist layer 37, will be referred to as the other surface or a lower surface. However, the embedded PCB 1 may be used in an upside-down state, or in an inclined state inclined at an arbitrary angle. Moreover, a plan view refers to a view of an object viewed from above the object in a normal direction to one surface of the solder resist layer 13, and a planar shape of the object refers to a shape of the object in the plan view viewed from above the object in the normal direction to the one surface of the solder resist layer 13. In a case where the embedded PCB 1 is illustrated in an upside-down state compared to FIG. 1, definitions of the upper surface and the lower surface will be opposite to those described above in accordance with the upside-down state of the embedded PCB 1.

The substrate 10 includes an insulating layer 11, an interconnect layer 12, the solder resist layer 13, an interconnect layer 14, and a solder resist layer 15.

In the substrate 10, a so-called glass epoxy substrate or the like having a glass cloth impregnated with an insulating resin, such as an epoxy-based resin or the like, can be used for the insulating layer 11, for example. A substrate or the like having a woven fabric or a nonwoven fabric of glass fiber, carbon fiber, aramid fiber, or the like impregnated with the insulating resin, such as the epoxy-based resin or the like, can also be used for the insulating layer 11, for example. A thickness of the insulating layer 11 may be in a range of approximately 60 μm to approximately 200 μm, for example. In each drawing, illustration of the glass cloth or the like will be omitted.

The interconnect layer 12 is formed on one surface of the insulating layer 11. The interconnect layer 12 is electrically connected to the interconnect layer 14 through via interconnects of the interconnect layer 12 penetrating the insulating layer 11. The interconnect layer 12 includes the via interconnects filling via holes 11x penetrating the insulating layer 11 and exposing one surface of the interconnect layer 14, and an interconnect pattern formed on the one surface of the insulating layer 11.

The via hole 11x may be a cavity having an inverted truncated cone shape, and a diameter of an opening of the cavity at one end which opens to the solder resist layer 13 is greater than a diameter of an opening of the cavity at the other end (that is, a bottom surface of the cavity) formed by an upper surface of the interconnect layer 14. A diameter of the opening of the via hole 11x, that opens at the one end to the solder resist layer 13, may be approximately 50 μm, for example. A material used for the interconnect layer 12 may be copper (Cu) or the like, for example. A thickness of the interconnect pattern forming the interconnect layer 12 may be in a range of approximately 10 μm to approximately 20 μm, for example.

The solder resist layer 13 is formed on the one surface of the insulating layer 11, so as to cover the interconnect layer 12. The solder resist layer 13 can be formed of a photosensitive resin or the like, for example. A thickness of the solder resist layer 13 may be in a range of approximately 15 μm to approximately 35 μm, for example. The solder resist layer 13 has openings 13x, and portions of the interconnect layer 12 are exposed inside the openings 13x. The interconnect layer 12 exposed inside the openings 13x includes pads 12p. The pads 12p function as pads to be electrically connected to an electronic component (not illustrated), such as a semiconductor chip, a semiconductor package, or the like.

The solder resist layer 13 may be provided so as to completely expose the pads 12p. In this case, the solder resist layer 13 may be provided so that a side surface of the pad 12p and an inner wall surface of the opening 13x make contact with each other. Alternatively, the solder resist layer 13 may be provided so that a gap is formed between the side surface of the pad 12p and the inner wall surface of the opening 13x.

A metal layer may be formed on one surface of the pad 12p, or the one surface of the pad 12p may be subjected to an anti-oxidation treatment, such as an organic solderability preservative (OSP) treatment or the like, as required. Examples of the metal layer include a Au layer, a Ni/Au layer (that is, a metal layer in which a Ni layer and a Au layer are laminated in this order), a Ni/Pd/Au layer (that is, a metal layer in which a Ni layer, a Pd layer, and a Au layer are laminated in this order), or the like. Further, an external connection terminal, such as a solder ball or the like, may be formed on one surface of the pad 12p.

The interconnect layer 14 is formed on the other surface of the insulating layer 11. The one surface of the interconnect layer 14 makes contact with and is electrically connected to a lower end portion of the via interconnect filling the via holes 11x of the interconnect layer 12. A material and a thickness of the interconnect layer 14 may be similar to those of the interconnect pattern forming the interconnect layer 12, for example.

The solder resist layer 15 is formed on the other surface of the insulating layer 11, so as to cover the interconnect layer 14. A material and a thickness of the solder resist layer 15 may be similar to those of the solder resist layer 13, for example. The solder resist layer 15 has openings 15x, and portions of the interconnect layer 14 are exposed inside the openings 15x. The interconnect layer 14 exposed inside the openings 15x includes pads 14p. The pads 14p function as pads to be electrically connected to the substrate bonding members 20, respectively. The metal layer described above may be formed on the other surface of the pad 14p, or the other surface of the pad 14p may be subjected to an anti-oxidation treatment, such as the OSP treatment or the like, as required.

The substrate 30 includes an insulating layer 31, an interconnect layer 32, an insulating layer 33, an interconnect layer 34, a solder resist layer 35, an interconnect layer 36, and a solder resist layer 37.

In the substrate 30, a material and a thickness of the insulating layer 31 may be similar to those of the insulating layer 11, for example. The interconnect layer 32 is formed on one surface of the insulating layer 31. A material and a thickness of the interconnect layer 32 may be similar to those of the interconnect pattern forming the interconnect layer 12, for example.

The insulating layer 33 is formed on one surface of the insulating layer 31 so as to cover the interconnect layer 32. A material used for the insulating layer 33 may be an insulating resin, such as a thermosetting epoxy-based resin or the like, for example. The insulating layer 33 may include a filler, such as silica ($SiO_2$) or the like. A thickness of the insulating layer 33 may be in a range of approximately 15 μm to approximately 35 μm, for example.

The interconnect layer 34 is formed on one surface of the insulating layer 33. The interconnect layer 34 includes a via interconnect filling a via hole 33x penetrating the insulating layer 33 and exposing one surface of the interconnect layer 32, and an interconnect pattern formed on the one surface of the insulating layer 33.

The via hole 33x may be a cavity having an inverted truncated cone shape, and a diameter of an opening of the cavity at one end which opens to the solder resist layer 35 is greater than a diameter of an opening of the cavity at the other end (that is, a bottom surface of the cavity) formed by an upper surface of the interconnect layer 32. A material used for the interconnect layer 34, and a thickness of the interconnect pattern forming the interconnect layer 34, may be similar to those of the interconnect layer 12, for example.

The solder resist layer 35 is an example of a protective insulating layer formed on the one surface of the insulating layer 33, so as to cover the interconnect layer 34. A material and a thickness of the solder resist layer 35 may be similar to those of the solder resist layer 13, for example. The solder resist layer 35 has openings 35x, and portions of the interconnect layer 34 are exposed inside the openings 35x. The interconnect layer 34 exposed inside the openings 35x includes pads 34p and 34q.

The pads 34p function as pads to be bonded to the substrate bonding members 20, respectively. The pads 34q function as pads to be bonded to electrodes 52 of the semiconductor chip 50 via the bonding portions 40, respectively. The pads 34q are formed on the side of the substrate 30 closer to the semiconductor chip 50. An opening diameter of the pads 34p electrically connected to the substrate bonding members 20, and an opening diameter of the pads 34q electrically connected to the semiconductor chip 50, can be set independently. The metal layer described above may be formed on one surface of each of the pads 34p and 34q, or the one surface of the pads 34p and 34q may be subjected to an anti-oxidation treatment, such as the OSP treatment or the like, as required.

The interconnect layer 36 is formed on the other surface of the insulating layer 31. The interconnect layer 36 includes a via interconnect filling via holes 31x penetrating the insulating layer 31 and exposing the other surface of the interconnect layer 32, and an interconnect pattern formed on the other surface of the insulating layer 31.

The via hole 31x may be a cavity having a truncated cone shape, and a diameter of an opening of the cavity at one end which opens to the solder resist layer 37 is greater than a diameter of an opening of the cavity at the other end (that is, a bottom surface of the cavity) formed by a lower surface of the interconnect layer 32. An upper end portion of the via interconnect of the interconnect layer 36 filling the via holes 31x makes contact with and is electrically connected to the other surface of the interconnect layer 32. A material used for the interconnect layer 36, and a thickness of the interconnect pattern forming the interconnect layer 36, may be similar to those of the interconnect layer 12, for example.

The solder resist layer 37 is formed on the other surface of the insulating layer 11, so as to cover the interconnect layer 36. A material and a thickness of the solder resist layer 37 may be similar to those of the solder resist layer 13, for example. The solder resist layer 37 has openings 37x, and portions of the interconnect layer 36 are exposed inside the openings 37x. The interconnect layer 36 exposed inside the openings 37x includes pads 36p. The pads 36p function as pads to be electrically connected to a mounting substrate (not illustrated), such as a mother board or the like. Further, an external connection terminal, such as a solder ball or the like, may be formed on the other surface of the pad 36p. The metal layer described above may be formed on the other surface of the pad 36p, or the other surface of the pad 36p may be subjected to an anti-oxidation treatment, such as the OSP treatment or the like, as required.

The semiconductor chip 50 is flip-chip bonded face-down (that is, in a state where a circuit forming surface opposes one surface of the substrate 30) on one surface of the substrate 30. More particularly, the semiconductor chip 50 includes a chip body 51 provided with a semiconductor integrated circuit, and electrodes 52 that are connection terminals. The electrodes 52 of the semiconductor chip 50 are electrically connected to the pads 34q of the substrate 30 via the bonding portions 40, respectively. For example, a gold bump, a solder bump, a copper post with solder provided at a tip end thereof, or the like can be used for the electrode 52. For example, a solder material such as an alloy including Pb, an alloy of Sn and Cu, an alloy of Sn and Sb, an alloy of Sn and Ag, an alloy of Sn, Ag, and Cu, or the like, similar to the solder material described above, can be used for the bonding portion 40. The electrical connection between the substrate 30 and the semiconductor chip 50 will be separately described later in more detail.

Instead of providing the semiconductor chip, a so-called chip size package (CSP) in which a redistribution layer is formed in the semiconductor chip, may be embedded in the mold resin 60. Alternatively, the semiconductor chip and the CSP may coexist in the mold resin 60. In addition, a passive element, such as a capacitor, an inductor, a resistor, or the like may coexist with the semiconductor chip. The passive element may coexist with the CSP. The passive element may coexist with the semiconductor chip and the CSP.

The substrate bonding members 20 are arranged between the pads 14p of the substrate 10 and the pads 34p of the substrate 30, respectively. The substrate bonding members 20 have a function of electrically connecting the substrate 10 and the substrate 30, and a function of securing a predetermined gap between the substrate 10 and the substrate 30.

In the present embodiment, a solder ball with a core, for example, is used for the substrate bonding member 20. The substrate bonding member 20 includes an approximately spherical core 21, and a conductive material 22 covering an outer peripheral surface of the core 21. The core 21 is arranged so as to make contact with the pad 14p and the pad 34p. A diameter of the core 21 before being bonded to the substrate 10 and the substrate 30 may be in a range of approximately 100 μm to approximately 300 μm, and preferably approximately 200 μm, for example. A diameter of the entire substrate bonding member 20 including the conductive material 22, before being bonded to the substrate 10 and the substrate 30, may be in a range of approximately 150 μm to approximately 350 μm, and preferably approximately 250 μm, for example.

For example, a metal core made of a metal such as copper or the like, a resin core made of a resin, or the like can be used for the core 21. For example, a solder material, such as an alloy including Pb, an alloy of Sn and Cu, an alloy of Sn and Sb, an alloy of Sn and Ag, an alloy of Sn, Ag, and Cu, or the like can be used for the conductive material 22. The diameter of the core 21 can be determined by taking into consideration heights (or thicknesses) of the semiconductor chip 50 and a resin film 55.

The substrate bonding member 20 is not limited to the solder ball with the core, including the core 21 and the conductive material 22 covering the outer peripheral surface of the core 21. For example, a solder ball or the like without a core may be used for the substrate bonding member 20. In a case where the solder ball or the like without the core is used for the substrate bonding member 20, the gap between the substrate and the substrate 30 can be controlled using a predetermined jig during the manufacturing process of the embedded PCB 1. In addition, a metal post such as a copper post or the like, or a metal bump such as a gold bump or the like, may be used for the substrate bonding member 20. In a case where a thickness of the embedded component of the embedded PCB 1 becomes large, the metal post is used for the substrate bonding member 20 from a viewpoint of design efficiency. A diameter and a height of the metal post are determined by the thickness of the embedded component of the embedded PCB 1. A ratio of a height L and a diameter D of the metal post is preferably in a range of approximately 1.2 to approximately 2.0, for example, although the ratio may depend on a method for mounting the metal post. For example, in a case where the height H of the metal post is designed to be 500 µm, the diameter D of the metal post is preferably approximately 350 µm.

Although the substrate bonding members 20 are illustrated in a simplified manner in FIG. 1, multiple columns of substrate bonding members 20 are actually arranged in a peripheral, for example. In a case where the substrate 10 and the substrate 30 have a rectangular shape in the plan view, the substrate bonding members 20 are provided at peripheral edges of the substrate, in the peripheral, for example. For example, in a case where the diameter of the substrate bonding member 20 is approximately 150 µm, a pitch of the substrate bonding members 20 may be approximately 200 µm.

The mold resin 60 is an example of an encapsulating resin that is filled between opposing surfaces of the substrate 10 and the substrate 30, and covers the substrate bonding members 20 and the semiconductor chip 50. The mold resin 60 covers the semiconductor chip 50, and is filled between the semiconductor chip 50 and the substrate 30, and covers the bonding portions 40 and the electrodes 52. For example, an insulating resin, such as a thermosetting epoxy-based resin including a filler, or the like can be used for the mold resin 60.

Figure 2A:
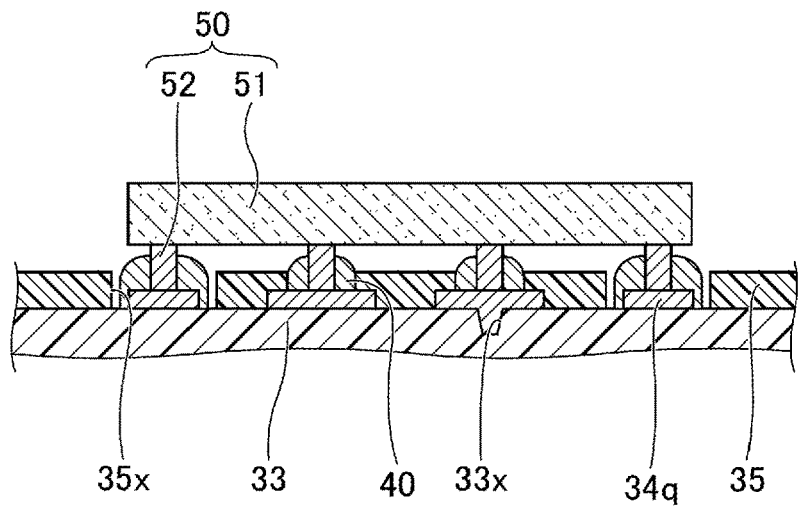
FIG. 2A and FIG. 2B are partially enlarged views of a vicinity of a semiconductor chip illustrated in FIG. 1.
Figure 2B:
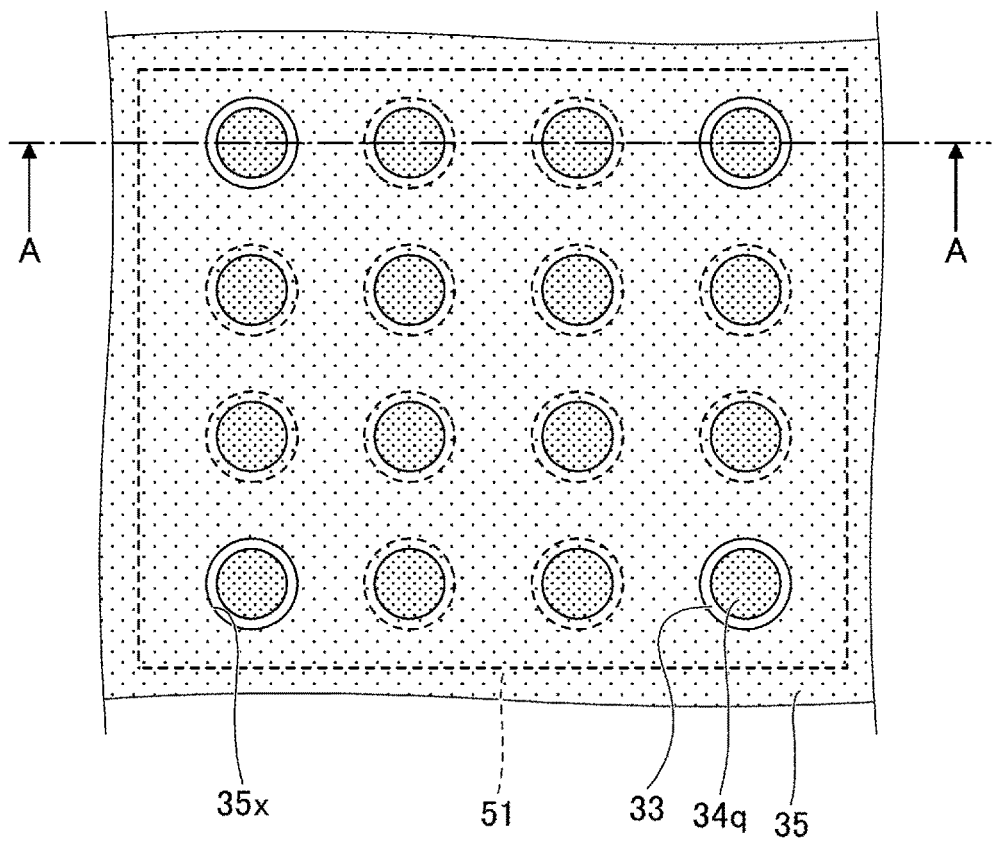

Next, the electrical connection between the substrate 30 and the semiconductor chip 50 will be described in detail. FIG. 2A and FIG. 2B are partially enlarged views of a vicinity of the semiconductor chip illustrated in FIG. 1. FIG. 2B is a plan view, and FIG. 2A is a cross sectional view along a line A-A in FIG. 2B. In FIG. 2A and FIG. 2B, only portions necessary for the description are illustrated for the sake of convenience.

As illustrated in FIG. 2B, in the substrate 30, the pads 34q electrically connected to the semiconductor chip 50 are arranged in an array in an approximately rectangular area. More particularly, the pads 34q include outermost peripheral pads separated from one another and arranged at positions in an outermost periphery including four corners of the approximately rectangular area in the plan view, and inner pads separated from one another and arranged at positions in an area surrounded by the outermost peripheral pads in the plan view.

In the example illustrated in FIG. 2B, a total of 16 pads 34q, formed by 4 rows×4 columns of the pads 34q, are arranged at an approximately constant pitch. In this case, 12 pads 34q arranged at the outermost periphery are the outermost peripheral pads, and 4 pads 34q arranged on the inner side are the inner pads. However, FIG. 2B merely illustrates an example, and the number and arrangement of the pads 34q may be appropriately determined according to specifications of the semiconductor chip to be mounted. In addition, the arrangement of the pads 34q is not limited to the array in the approximately rectangular area, and the pads 34q may be arranged in multiple columns in the peripheral, for example.

In the present embodiment, the outermost peripheral pads arranged at the four corners, among the outermost peripheral pads included in the multiple pads 34q, have a non-solder mask defined (NSMD) structure. That is, the outermost peripheral pads arranged at the four corners are exposed inside the openings 35x in a state separated from the solder resist layer 35. In other words, a gap is formed between a side surface of the outermost peripheral pad arranged at one of the four corners and the inner wall surface of one of the openings 35x of the solder resist layer 35 exposing the outermost peripheral pad, and the side surface of the outermost peripheral pad and the inner wall surface of the opening 35x exposing the outermost peripheral pad do not make contact with each other.

On the other hand, all the inner pads included in the pads 34q have a solder mask defined (SMD) structure. That is, an outer periphery of the inner pad is covered with the solder resist layer 35, and a portion of an upper surface of the inner pad is exposed inside the opening 35x. Among the outermost peripheral pads included in the pads 34q, the outermost peripheral pads arranged at positions other than the four corners may either have the NSMD structure or the SMD structure. However, in the example described in the present embodiment, the outermost peripheral pads arranged at the positions other than the four corners have the SMD structure.

As illustrated in FIG. 2A, the bonding portion bonded to the pad 34q having the SMD structure is narrower than the bonding portion 40 bonded to the pad 34q having the NSMD structure. For this reason, the pads 34q having the SMD structure are suited for arrangement at a fine pitch, because adjacent bonding portions 40 are less likely to be short-circuited. However, because the outer periphery of the pad 34q having the SMD structure is covered with the solder resist layer 35, the area of the upper surface of the pad 34q having the SMD structure needs to be larger than that of the pad 34q having the NSMD structure, in order to secure the area of the upper surface of the pad 34q exposed inside the opening 35x. In other words, the area of the upper surface of the pad 34q having the NSMD structure that is entirely exposed inside the opening 35x can be made smaller than the area of the upper surface of the pad 34q having the SMD structure.

Moreover, as illustrated in FIG. 2A, the upper surface and the side surface of the pad 34q having the NSMD structure are bonded to the bonding portion 40. For this reason, a bonding strength between the pad 34q having the NSMD structure and the bonding portion 40 can be made higher than a bonding strength between the pad 34q having the SMD structure and the bonding portion 40, because only the upper surface of the pad 34q having the SMD structure is bonded to the bonding portion 40.

Although details will be described later, in a process or step of bonding the substrate 10 and the substrate 30, a thermal stress is applied to a bonding portion between the pad 34q and the bonding portion 40. In particular, a large thermal stress is applied to the bonding portion between the pad 34q arranged at each of the four corners and the bonding portion 40, and the bonding portion 40 may break due to the large thermal stress. The breaking of the bonding portion 40 refers to a crack generated in the bonding portion 40, or a separation generated between the pad 34q and the bonding portion 40.

Accordingly, in the present embodiment, the pads 34q arranged at the four corners have the NSMD structure, and the other pads 34q have the SMD structure, so that the bonding strength between the pad 34q arranged at each of the four corners and having the NSMD structure and the bonding portion 40 is high, while the advantageous features of the pad 34q having the SMD structure are maintained. As a result, it is possible to reduce the breaking of the bonding portions 40 bonded to the pads 34q arranged at the four corners, and to improve a bonding reliability between the substrate 30 and the semiconductor chip 50.

As described above, by making the pads 34q, that are arranged at the positions where the thermal stress is likely applied, have the NSMD structure, it is possible to provide the embedded PCB 1 in which the bonding strength between the substrate 30 and the semiconductor chip 50 is improved.

[Method for Manufacturing Embedded PCB]

Next, a method for manufacturing the embedded PCB according to the first embodiment will be described. FIG. 3A through FIG. 5B are diagrams illustrating examples of manufacturing processes of the embedded PCB according to the first embodiment.

Figure 3A:
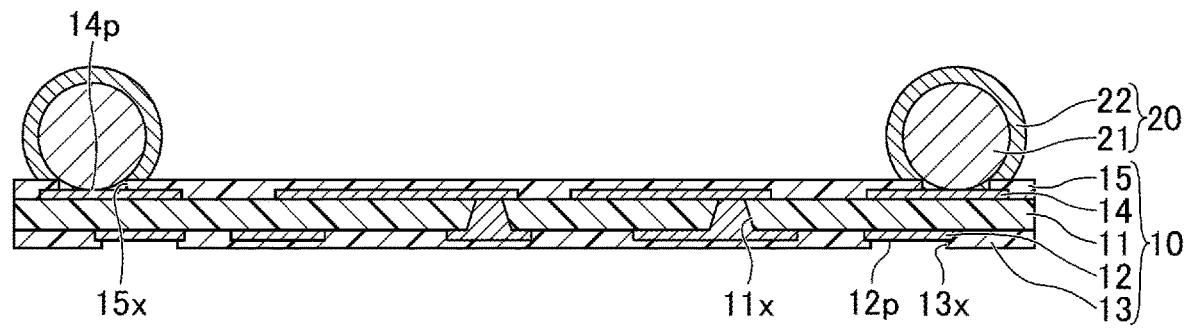
FIG. 3A, FIG. 3B, and FIG. 3C are diagrams (part 1) illustrating examples of manufacturing processes of the embedded printed circuit board according to the first embodiment.

First, in a process or step illustrated in FIG. 3A, the substrate 10 is manufactured, and the substrate bonding members 20 are provided on the pads 14p of the substrate 10. More particularly, the insulating layer 11 using the so-called glass epoxy substrate or the like described above is prepared, and the interconnect layer 14 is formed on the other surface of the insulating layer 11. Next, the via holes 11x exposing the one surface of the interconnect layer 14 are formed in the insulating layer 11, and further, the interconnect layer 12 is formed on the one surface of the insulating layer 11. The interconnect layer 12 and the interconnect layer 14 are electrically connected through the via interconnects of the interconnect layer 12 penetrating the insulating layer 11.

After forming the via holes 11x, it is preferable to perform a desmear process to remove resin residue adhered to the surface of the interconnect layer 14 exposed at the bottom of the via holes 11x. The via holes 11x can be formed by laser beam machining using a $CO_2$ laser or the like, for example. The interconnect layers 12 and 14 can be formed using various interconnect forming methods, such as a semi-additive method, a subtractive method, or the like. The interconnect layers 12 and 14 can be formed by copper plating or the like, for example.

Next, the solder resist layer 13, that covers the interconnect layer 12, is formed on the one surface of the insulating layer 11, and the solder resist layer 15, that covers the interconnect layer 14, is formed on the other surface of the insulating layer 11. The solder resist layer 13 can be formed by coating a liquid or paste of an insulating resin, such as a photosensitive epoxy-based resin or the like, for example, on the one surface of the insulating layer 11 by screen printing, roll coating, spin coating, or the like, so as to cover the interconnect layer 12.

Similarly, the solder resist layer 15 can be formed by coating a liquid or paste of an insulating resin, such as a photosensitive epoxy-based resin or the like, for example, on the other surface of the insulating layer 11 by a similar method, so as to cover the interconnect layer 14. Alternatively, instead of coating the liquid or paste of the resin, a film of the insulating resin, such as the photosensitive epoxy-based resin or the like, for example, may be laminated on the other surface of the insulating layer 11.

Then, by exposing and developing the coated or laminated insulating resins, the openings 13x and 15x are formed in the solder resist layers 13 and 15, respectively, and the pads 12p and 14p are formed using photolithography. Accordingly, the substrate 10 is completed. The openings 13x and 15x may be formed by the laser beam machining or blasting. The planar shape of each of the openings 13x and 15x may be a circular shape, for example. Diameters of the openings 13x and 15x can be arbitrarily designed according to a bonding target.

Next, the substrate bonding members 20 are placed on the pads 14p exposed inside the openings 15x of the solder resist layer 15 of the substrate 10. Then, the substrate bonding members 20 are heated to a predetermined temperature so as to melt the conductive material 22 forming the substrate bonding members 20, and the conductive material 22 is thereafter cured to be bonded to the pads 14p. A portion of the core 21 forming the substrate bonding member 20 makes contact with the pad 14p. The substrate bonding members 20 are arranged in a peripheral, for example.

Figure 3B:
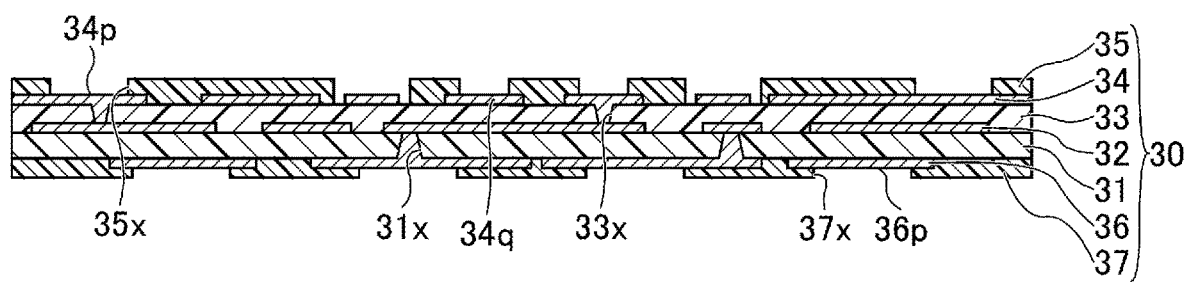

Next, in a process or step illustrated in FIG. 3B, the substrate 30 that includes the pads 34p, the pads 34q, and the solder resist layer 35 including the openings 35x that expose at least a portion of the pads 34p and the pads 34q, is prepared. More particularly, the insulating layer 31 using the so-called glass epoxy substrate or the like described above is prepared, and the interconnect layer 32 is formed on the one surface of the insulating layer 31. Next, the via holes 31x, exposing the other surface of the interconnect layer 32, are formed in the insulating layer 31, and further, the interconnect layer 36 is formed on the other surface of the insulating layer 31. The interconnect layer 32 and the interconnect layer 36 are electrically connected through the via interconnects of the interconnect layer 36 penetrating the insulating layer 31.

After forming the via holes 31x, it is preferable to perform a desmear process to remove resin residue adhered to the surface of the interconnect layer 32 exposed at the bottom of the via holes 31x. The via holes 31x can be formed by laser beam machining using a $CO_2$ laser or the like, for example. The interconnect layers 32 and 36 can be formed using various interconnect forming methods, such as the semi-additive method, the subtractive method, or the like.

Next, a film of an insulating resin, such as a thermosetting epoxy-based resin or the like, is laminated on the one surface of the insulating layer 31, so as to cover the interconnect layer 32, thereby forming the insulating layer 33. Alternatively, instead of laminating the film of the insulating resin, such as the thermosetting epoxy-based resin or the like, a liquid or paste of the insulating resin, such as the thermosetting epoxy-based resin or the like, may be coated on the one surface of the insulating layer 31 and thereafter cured, to form the insulating layer 33.

Next, the via hole 33x, that penetrates the insulating layer 33 and exposes the one surface of the interconnect layer 32, is formed in the insulating layer 33. The via hole 33x can be formed by laser beam machining using a $CO_2$ laser or the like, for example. After forming the via hole 33x, it is preferable to perform a desmear process to remove resin residue adhered to the surface of the interconnect layer 32 exposed at the bottom of the via hole 33x.

Next, the interconnect layer 34 is formed on the one side of the insulating layer 33. The interconnect layer 34 includes the via interconnect filling the via hole 33x, and the interconnect pattern formed on the one surface of the insulating layer 33. The interconnect layer 34 is electrically connected to the interconnect layer 32 exposed at the bottom of the via hole 33x. The interconnect layer 34 can be formed using various interconnect forming methods, such as the semi-additive method, the subtractive method, or the like.

Next, the solder resist layer 35 is formed on the one surface of the insulating layer 33, so as to cover the interconnect layer 34, and the solder resist layer 37 is formed on the other surface of the insulating layer 31, so as to cover the interconnect layer 36, similar to the solder resist layer 13 or the like of the substrate 10. Then, the openings 35x and 37x are formed in the solder resist layers 35 and 37, respectively, and the pads 34p and 36p are formed using photolithography, similar to the openings 13x or the like of the substrate 10. As a result, the substrate 30 is completed.

Figure 3C:
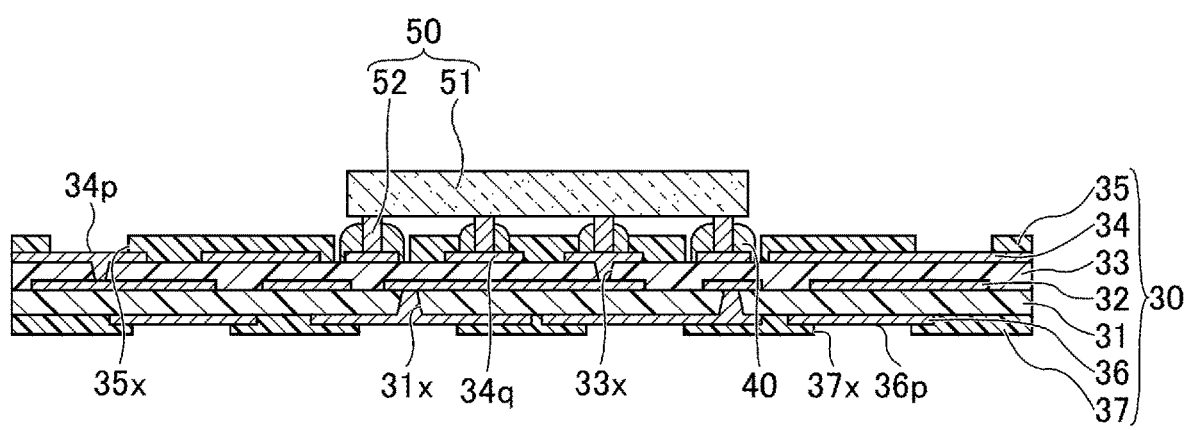

Next, in a process or step illustrated in FIG. 3C, the semiconductor chip 50 is mounted on the substrate 30, so that the electrodes 52 of the semiconductor chip 50 are bonded to the pads 34q via the bonding portions 40, respectively. More particularly, the bonding portions 40 are first formed on the pads 34q of the substrate 30. For example, the bonding portions 40 are formed by coating a paste of a solder material on the pads 34q. Then, the semiconductor chip 50, having the electrodes 52 formed on the side of the circuit forming surface of the chip body 51 provided with the semiconductor integrated circuit, is prepared, and a back surface of the semiconductor chip 50 is set on a lower surface of a pickup jig, for example. The pickup jig having the semiconductor chip 50 mounted on the lower surface thereof is then moved to an upper portion of the substrate 30, the electrodes 52 of the semiconductor chip 50 are aligned to positions of the bonding portions 40, and the semiconductor chip 50 is arranged on the substrate 30. After removing the pickup jig from the semiconductor chip 50, the bonding portions are heated and melted by a reflow process or the like, and thereafter solidified. As a result, the electrodes 52 of the semiconductor chip 50 are electrically connected to the pads 34q of the substrate 30 via the bonding portions 40, respectively.

Figure 4A:
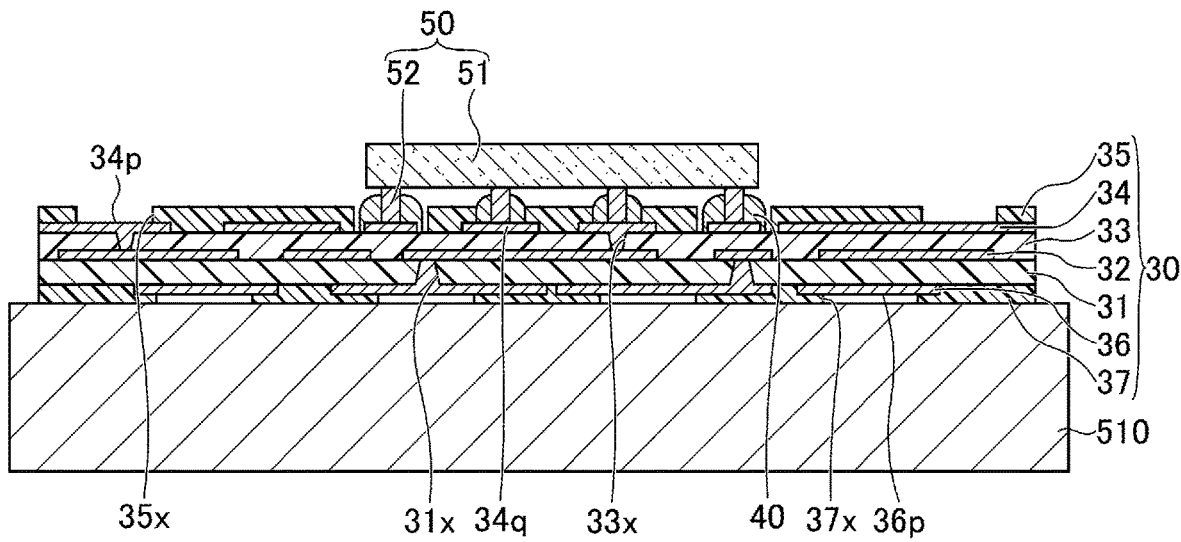
FIG. 4A and FIG. 4B are diagrams (part 2) illustrating examples of the manufacturing processes of the embedded printed circuit board according to the first embodiment.
Figure 4B:
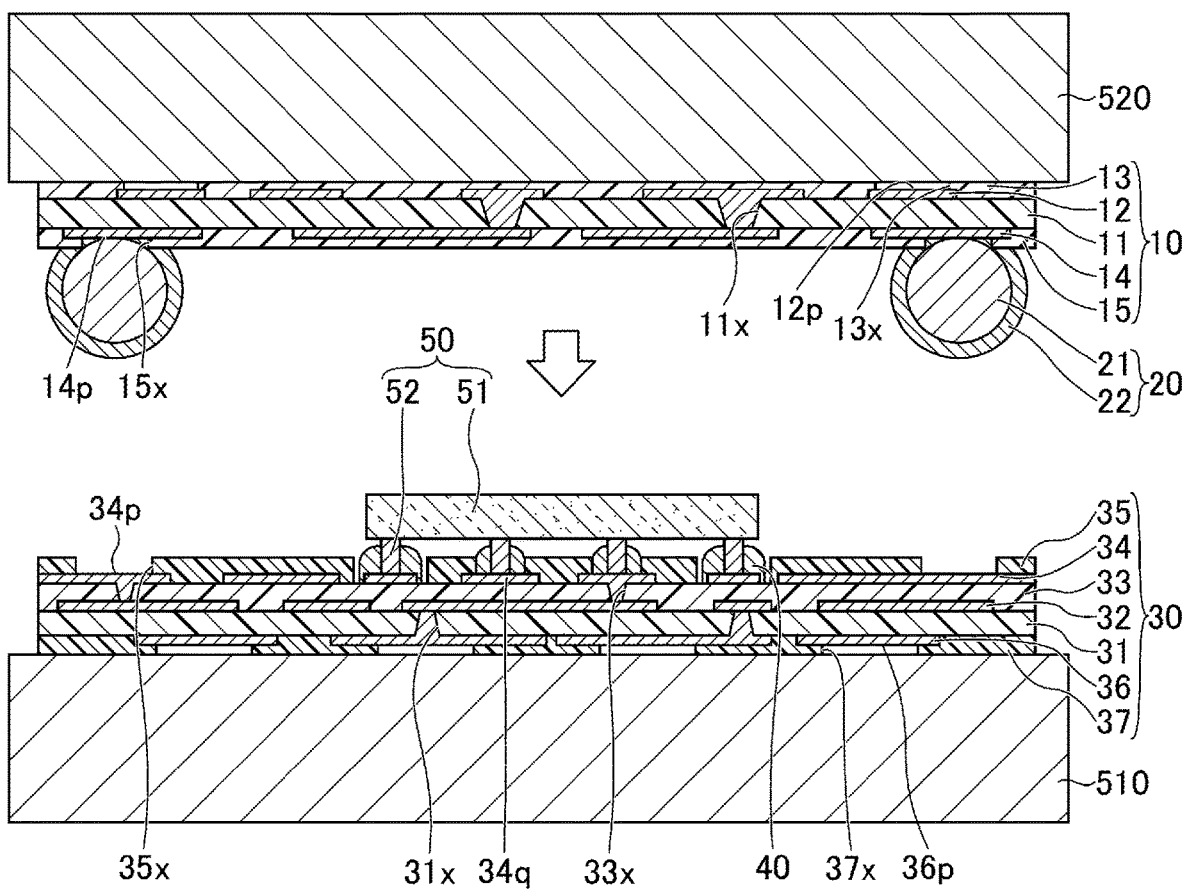

Next, in processes or steps illustrated in FIG. 4A through FIG. 5A, the substrate 10 is stacked on the substrate 30 with the semiconductor chip 50 interposed therebetween, so that the substrate bonding member 20 is located at a position corresponding to the position of the pad 34p, and the substrate 10 and the substrate 30 are electrically connected via the substrate bonding member 20. More particularly, first, as illustrated in FIG. 4A, the substrate 30 having the semiconductor chip 50 mounted thereon is placed on a first mold 510 having an embedded heater. Next, as illustrated in FIG. 4B, after placing the substrate 10 having the substrate bonding members 20 provided thereon is placed on a second mold 520 having an embedded heater, the substrate 10 and the second mold 520 are turned upside down, and the substrate 10 is aligned with the substrate 30 placed on the first mold 510.

Figure 5A:
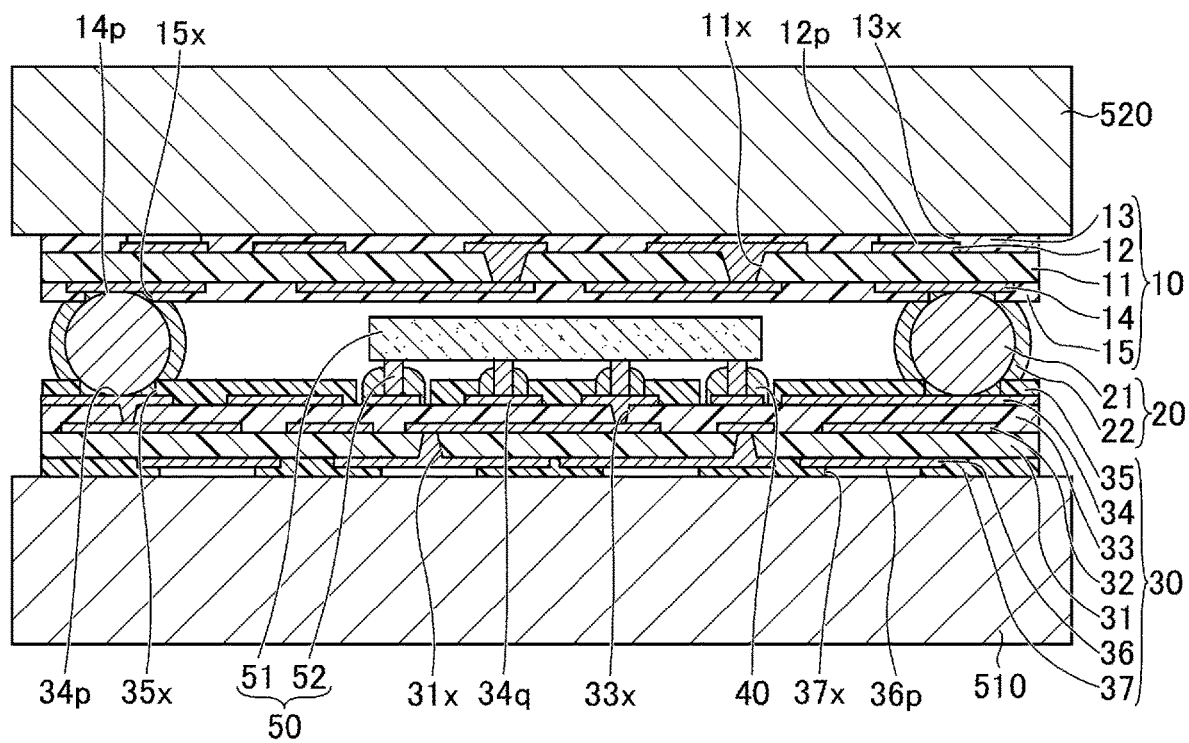
FIG. 5A and FIG. 5B are diagrams (part 3) illustrating examples of the manufacturing processes of the embedded printed circuit board according to the first embodiment.

Next, as illustrated in FIG. 5A, the substrate and the substrate 30 are bonded by thermal compression bonding (TCB). First, a distance between the first mold 510 and the second mold 520 is adjusted, a stacked body of the substrate 10 and the substrate 30 is held between the first mold 510 and the second mold 520, and the substrate 10 is pressed toward the substrate 30 at a predetermined pressure, so as to apply a pressure on the stacked body. Then, the first mold 510 and the second mold 520 are heated by the respective embedded heaters in a state where the pressure is applied on the stacked body. Accordingly, heat from the first mold 510 is transferred to the substrate bonding members 20 via the substrate 10, and heat from the second mold 520 is transferred to the substrate bonding members 20 via the substrate 30, thereby causing the conductive material 22 of the substrate bonding members 20 to melt. A heating temperature of the embedded heaters is higher than or equal to a temperature at which the conductive material 22 melts, and the heating temperature may be approximately 250° C., for example.

Thereafter, because the conductive material 22 solidifies, the upper side of the core 21 forming the substrate bonding member 20 is bonded to the pad 14p of the substrate 10, and the lower side of the core 21 is bonded to the pad 34p of the substrate 30. That is, the substrate 10 and the substrate 30 are electrically connected via the substrate bonding member 20. In addition, the core 21 of the substrate bonding member 20 secures a predetermined gap between the substrate 10 and the substrate 30. In this process or step, because the substrate 10 is pressed toward the substrate 30 by the first mold 510 and the second mold 520, even if the substrate 10 or the substrate 30 expands due to heating, the gap between the substrate 10 and the substrate 30 can be prevented from varying. As a result, the substrate 10 and the substrate 30 can be bonded in a state where the distance between the substrate 10 and the substrate 30 is a desired value determined by the core 21.

Figure 5B:
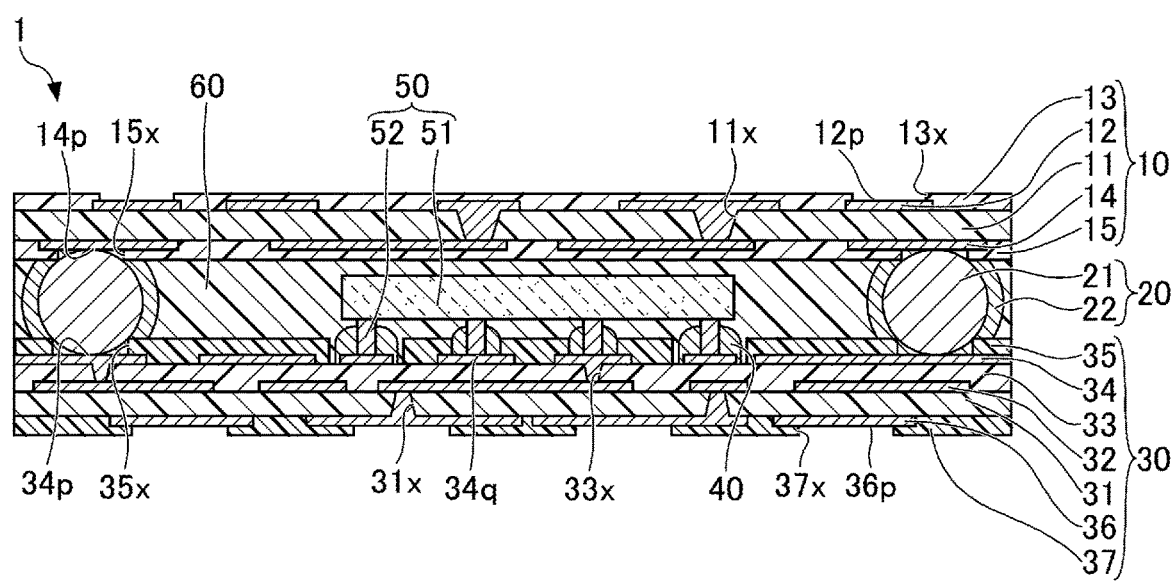

Next, in a process or step illustrated in FIG. 5B, the mold resin 60 is filled between the substrate 10 and the substrate 30, so as to encapsulate the substrate bonding members 20 and the semiconductor chip 50. The mold resin 60 covers the semiconductor chip 50, is filled between the semiconductor chip 50 and the substrate 30, and covers the bonding portions 40 and the electrodes 52. For example, an insulating resin, such as a thermosetting epoxy-based resin or the like including a filler, can be used for the mold resin 60. The mold resin 60 can be formed by transfer molding using an encapsulating mold, for example.

Accordingly, by also filling the mold resin 60 between the semiconductor chip 50 and the substrate 30, it becomes unnecessary to provide a separate process or step to fill an underfill resin or the like between the semiconductor chip 50 and the substrate 30, thereby simplifying the manufacturing process of the embedded PCB 1.

The embedded PCB 1 is completed by the processes or steps described above. External connection terminals, such as solder balls or the like, may be formed on the pads 36p, as required.

In the process (TCB process) illustrated in FIG. 5A, because the substrate 10 and the substrate 30 are heated by the first mold 510 and the second mold 520, the substrate 10 and the substrate 30 undergo thermal expansion. On the other hand, because the heat from the embedded heaters of the first mold 510 and the second mold 520 unlikely reaches the semiconductor chip 50, the semiconductor chip 50 at the bonding portions 40 does not undergo thermal expansion, and only the side of the semiconductor chip 50 closer to the substrate 30 undergoes the thermal expansion. In addition, at this stage, the vicinity of the bonding portion 40 is exposed between the substrate 10 and the substrate 30, and is not protected by a protective material, such as the resin or the like. For this reason, a large thermal stress is applied to the bonding portion between the pad 34q and the bonding portion 40. The large thermal stress is applied to the bonding portion between the pad 34q arranged at the outer periphery and the bonding portion 40, and in particular, the large thermal stress is applied to the bonding portion between the pad 34q at each of the four corners and the bonding portion 40. However, because the pads 34q the substrate 30, located at the four corners, have the NSMD structure to increase the bonding strength between each of the pads 34q and the bonding portion 40, the bonding portion 40 will not break due to the thermal stress, and the substrate 30 and the semiconductor chip 50 can be bonded with a high reliability.

Second Embodiment

A second embodiment is an example in which the arrangement of the pads having the NSMD structure is different from that of the first embodiment, as will be described below. In the second embodiment, a description of the same components as those in the above described embodiment may be omitted.

Figure 6A:
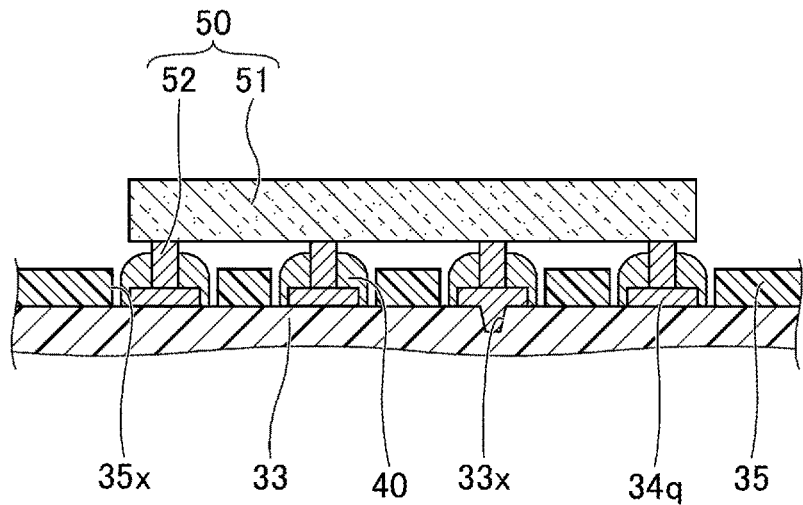
FIG. 6A and FIG. 6B are partial enlarged views of the vicinity of the semiconductor chip of the embedded printed circuit board according to a second embodiment.
Figure 6B:
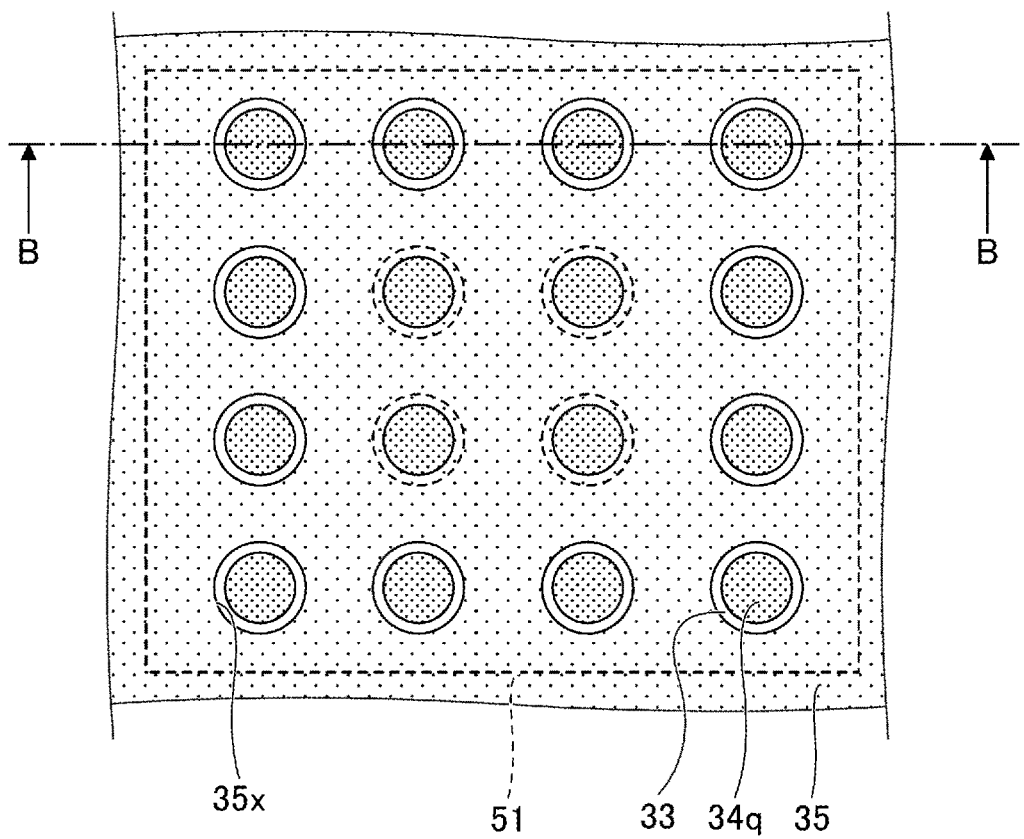

FIG. 6A and FIG. 6B are partially enlarged views of the vicinity of the semiconductor chip of the embedded PCB according to the second embodiment. FIG. 6B is a plan view, and FIG. 6A is a cross sectional view along a line B-B in FIG. 6B. In FIG. 6A and FIG. 6B, only portions necessary for the description are illustrated for the sake of convenience.

As illustrated in FIG. 6A and FIG. 6B, in the embedded PCB according to the second embodiment, all of the outermost peripheral pads have the NSMD structure. In the process (TCB process) illustrated in FIG. 5A, a large thermal stress is applied particularly to the bonding portion between the pad 34q and the bonding portion 40 at the four corners, but a relatively large thermal stress is also applied to the bonding portion between the pad 34q and the bonding portion 40 located at the outermost periphery other than the four corners. For this reason, the substrate 30 and the semiconductor chip 50 can be bonded with a high reliability, by making all of the pads 34q located at the outermost periphery have the NSMD structure.

It is not essential for all of the outermost peripheral pads to have the NSMD structure, and at least one outermost peripheral pad, among the outermost peripheral pads arranged at positions other than the four corners, may have the NSMD structure. In this case, it is also possible to bond the substrate 30 and the semiconductor chip 50 with a high reliability.

Although preferred embodiments have been described above in detail, the present invention is not limited to the above described embodiments, and various variations, modifications, and substitutions can be made to the above described embodiments without departing from the scope of the present invention.

For example, a build-up substrate or the like in which a larger number of interconnect layers and a larger number of insulating layers are formed, may be used as the first substrate and the second substrate. In this case, a coreless build-up substrate may be used, or a build-up substrate with a core may be used as the build-up substrate. Alternatively, a lead frame may be used as the first substrate.

According to the disclosed technique, it is possible to provide an embedded PCB having an improved bonding strength between a first substrate and an electronic component.

Various aspects of the subject-matter described herein may be set out non-exhaustively in the following numbered clauses:

1. A method for manufacturing an embedded printed circuit board, the method comprising:
preparing a first substrate including a plurality of first pads, a second pad, and a protective insulating layer including openings exposing at least a portion of each of the first pads and the second pad, and mounting an electronic component on the first substrate so that electrodes of the electronic component are bonded to the plurality of first pads via bonding portions;
arranging a substrate bonding member at a position corresponding to the second pad, stacking a second substrate on the first substrate with the electronic component interposed therebetween, and electrically connecting the first substrate and the second substrate via the substrate bonding member; and
filling an encapsulating resin between the first substrate and the second substrate, wherein
the filling covers the electronic component with the encapsulating resin, and also fills the encapsulating resin between the electronic component and the first substrate,
the arranging holds a stacked body of the first substrate and the second substrate between a first mold having an embedded heater and a second mold having an embedded heater, and heats the first mold and the second mold by the embedded heaters in a state where a pressure is applied to the stacked body, so as to bond the substrate bonding member and the second pad,
the plurality of first pads includes
outermost peripheral pads separated from one another and arranged at positions in an outermost periphery including four corners of an approximately rectangular area in a plan view, and
inner pads separated from one another and arranged at positions in an area surrounded by the outermost peripheral pads in the plan view,
the outermost peripheral pads arranged at the four corners, among the outermost peripheral pads, are exposed inside the openings in a state separated from the protective insulating layer, and
outer peripheries of the inner pads are covered with the protective insulating layer, and portions of upper surfaces of the inner pads are exposed inside the openings.

2. The method for manufacturing the embedded printed circuit board according to clause 1, wherein at least one outermost peripheral pad, among the outermost peripheral pads arranged at positions other than the four corners, is exposed inside one of the openings in the state separated from the protective insulating layer.

3. The method for manufacturing the embedded printed circuit board according to clause 2, wherein all of the outermost peripheral pads are exposed inside the openings in the state separated from the protective insulating layer.

4. The method for manufacturing the embedded printed circuit board according to any one of clauses 1 to 3, wherein upper and side surfaces of the outermost peripheral pads exposed inside the openings in the state separated from the protective insulating layer make contact with the bonding portions.

5. The method for manufacturing the embedded printed circuit board according to any one of clauses 1 to 4, wherein an area of the upper surface of each of the outermost peripheral pads exposed inside the openings in the state separated from the protective insulating layer is smaller than an area of an upper surface of each of the inner pads.

The description above use terms such as "determine", or the like to describe the embodiments, however, such terms are abstractions of the actual operations that are performed.

Hence, the actual operations that correspond to such terms may vary depending on the implementation, as is obvious to those skilled in the art.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An embedded printed circuit board comprising:
   a first substrate;
   an electronic component mounted on the first substrate;
   a second substrate provided on a side opposite to the first substrate with the electronic component interposed therebetween, and electrically connected to the first substrate via substrate bonding members; and
   an encapsulating resin that is filled between the first substrate and the second substrate, covering the electronic component, and also filled between the electronic component and the first substrate, wherein
   the first substrate includes, on a side closer to the electronic component, multiple pads to be bonded to electrodes of the electronic component via bonding portions, and a protective insulating layer including openings,
   the multiple pads include
      outermost peripheral pads separated from one another and arranged at positions in an outermost periphery including four corners of an approximately rectangular area in a plan view, and
      inner pads separated from one another and arranged at positions in an area surrounded by the outermost peripheral pads in the plan view,
   the outermost peripheral pads arranged at the four corners, among the outermost peripheral pads, are exposed inside the openings in a state separated from the protective insulating layer, and
   outer peripheries of the inner pads are covered with the protective insulating layer, and portions of upper surfaces of the inner pads are exposed inside the openings.

2. The embedded printed circuit board as claimed in claim 1, wherein at least one outermost peripheral pad, among the outermost peripheral pads arranged at positions other than the four corners, is exposed inside one of the openings in the state separated from the protective insulating layer.

3. The embedded printed circuit board as claimed in claim 2, wherein all of the outermost peripheral pads are exposed inside the openings in the state separated from the protective insulating layer.

4. The embedded printed circuit board as claimed in claim 1, wherein upper and side surfaces of the outermost peripheral pads exposed inside the openings in the state separated from the protective insulating layer make contact with the bonding portions.

5. The embedded printed circuit board as claimed in claim 2, wherein upper and side surfaces of the outermost peripheral pads exposed inside the openings in the state separated from the protective insulating layer make contact with the bonding portions.

6. The embedded printed circuit board as claimed in claim 1, wherein an area of the upper surface of each of the outermost peripheral pads exposed inside the openings in the state separated from the protective insulating layer is smaller than an area of an upper surface of each of the inner pads.

7. The embedded printed circuit board as claimed in claim 2, wherein an area of the upper surface of each of the outermost peripheral pads exposed inside the openings in the state separated from the protective insulating layer is smaller than an area of an upper surface of each of the inner pads.

8. The embedded printed circuit board as claimed in claim 4, wherein an area of the upper surface of each of the outermost peripheral pads exposed inside the openings in the state separated from the protective insulating layer is smaller than an area of an upper surface of each of the inner pads.

9. The embedded printed circuit board as claimed in claim 1, wherein
   the outermost peripheral pads have a non-solder mask defined structure, and
   the inner pads have a solder mask defined structure.

* * * * *